(12) United States Patent
Melick et al.

(10) Patent No.: US 7,881,619 B2
(45) Date of Patent: *Feb. 1, 2011

(54) SYSTEM AND METHOD OF USING VARIABLE PULSES FOR SYMBOLOGY

(75) Inventors: Bruce D. Melick, Cedar Rapids, IA (US); David M. Snyder, Cedar Rapids, IA (US); Leslie D. Baych, Cedar Rapids, IA (US)

(73) Assignee: Lightwaves Systems, Inc., Cedar Rapids, IA (US)

( * ) Notice: Subject to any disclaimer, the term of this patent is extended or adjusted under 35 U.S.C. 154(b) by 617 days.

This patent is subject to a terminal disclaimer.

(21) Appl. No.: 10/967,859

(22) Filed: Oct. 18, 2004

(65) Prior Publication Data

US 2005/0094784 A1 May 5, 2005

Related U.S. Application Data

(63) Continuation-in-part of application No. 10/427,039, filed on Apr. 30, 2003, now Pat. No. 7,376,191, application No. 10/967,859, which is a continuation-in-part of application No. 09/698,793, filed on Oct. 27, 2000, now Pat. No. 6,868,419, application No. 10/967,859, and a continuation-in-part of application No. 09/812,545, filed on Mar. 20, 2001, now Pat. No. 7,561,808.

(60) Provisional application No. 60/376,592, filed on Apr. 30, 2002, provisional application No. 60/441,358, filed on Jan. 21, 2003, provisional application No. 60/162,094, filed on Oct. 28, 1999, provisional application No. 60/163,426, filed on Nov. 3, 1999, provisional application No. 60/220,749, filed on Jul. 26, 2000, provisional application No. 60/190,832, filed on Mar. 21, 2000.

(51) Int. Cl.
*H04B 10/04* (2006.01)
*H04B 10/12* (2006.01)
(52) U.S. Cl. ................... 398/189; 398/190; 398/191; 398/183
(58) Field of Classification Search ............ 375/353, 375/238, 239, 237, 242; 398/189, 190, 191, 398/183
See application file for complete search history.

(56) References Cited

U.S. PATENT DOCUMENTS

| 3,478,170 | A | * | 11/1969 | Hanni | 341/125 |
|---|---|---|---|---|---|
| 4,574,382 | A | * | 3/1986 | Ko | 375/253 |
| 4,817,115 | A | * | 3/1989 | Campo et al. | 375/238 |
| 5,675,609 | A | * | 10/1997 | Johnson | 375/237 |
| 6,198,783 | B1 | * | 3/2001 | Campana, Jr. | 375/346 |
| 6,496,104 | B2 | | 12/2002 | Kline | |
| 6,603,818 | B1 | * | 8/2003 | Dress et al. | 375/295 |
| 6,718,519 | B1 | * | 4/2004 | Taieb | 715/269 |
| 7,010,056 | B1 | * | 3/2006 | McCorkle et al. | 375/295 |
| 2001/0055353 | A1 | * | 12/2001 | Rybicki et al. | 375/353 |

* cited by examiner

*Primary Examiner*—M. R. Sedighian
(74) *Attorney, Agent, or Firm*—McKee, Voorhees & Sease, P.L.C.

(57) ABSTRACT

A method and system for storing and transmitting data using variable pulse characteristics to represent ASCII or UNICODE characters, of the value of a string of data using a number base higher than 2. Pulse characteristics are modified to correspond to different data values. Pulse characteristics can include pulse durations, pulse spacings, pulse amplitudes, pulse phases, pulse polarities, pulse shapes and/or other pulse characteristics.

31 Claims, 1 Drawing Sheet

SYSTEM AND METHOD OF USING VARIABLE PULSES FOR SYMBOLOGY

CROSS-REFERENCE TO RELATED APPLICATIONS

This application is a continuation-in-part of and claims priority to U.S. patent application, Ser. No. 10/427,039, entitled HIGH-BANDWIDTH DATA TRANSPORT SYSTEM, filed on Apr. 30, 2003 now U.S. Pat. No. 7,376,191, which was a conversion of 60/376,592 filed Apr. 30, 2002 and 60/441,358 filed Jan. 21, 2003, all of which are herein incorporated by reference in its entirety. This application is also a continuation-in-part and claims priority to Ser. No. 09/698,793 entitled METHOD OF TRANSMITTING DATA INCLUDING A STRUCTURED LINEAR DATABASE, filed on Oct. 27, 2000 now U.S. Pat. No. 6,868,419, which was a conversion of 60/162,094 filed Oct. 28, 1999, and 60/163,426 filed Nov. 3, 1999 and 60/220,749 filed Jul. 26, 2000, all of which are herein incorporated by reference in their entirety. This application is also a continuation-in-part of and claims priority to Ser. No. 09/812,545 entitled SYSTEM AND METHOD OF USING VARIABLE PULSES FOR SYMBOLOGY, filed on Mar. 20, 2001 now U.S. Pat. No. 7,561,808, which was a conversion of 60/190,832 filed Mar. 21, 2000 and which is herein incorporated by reference in their entirety.

FIELD OF THE INVENTION

A method and system for storing, transmitting, and receiving data using variable pulse characteristics to represent ASCII or UNICODE characters, or the value of a string of data using a number base higher than 2. The pulses used to store, transmit, and receive data may be electronic or photonic. The pulses may be transmitted wireless, on a conductive hard-wired medium, or over a fiber optic medium.

PROBLEMS IN THE ART

Currently, computers create, store, and access data which is coded using the binary language of 1's and 0's. Computers routinely access binary coded files remotely via a telecommunication network. Computers and telecommunication networks use the same binary language to create, store, and access data. At the stroke of a key a computer transforms various forms of input into a numerical representation. Many different methods of transformation have been put into effect. Morse Code was perhaps the first such method to be widely used. Today, the majority of systems all use a binary language or code to transform various forms of input into numerical representations and vice versa.

Much like Morse Code, binary numbers use only two variants to represent vast quantities of textual data. For instance, in 7-bit ASCII code, the textual number "3" is represented in binary as "0110011" and the textual letter "A" is represented in binary as "1000001". Each bit in the seven bit representation screen is either a "1" or a "0".

Problems arose with the use of many different types of binary encoding. The many different types of binary coding were not consistent and the many types of human language resulted in different textual representations from the same set of binary numbers. For instance, ASCII and ISO 646 were used for English-language data, while ISO 2022, an extension of ISO 646, is used for Latin based scripts common in Europe which tend to employ various accent marks. This new standard became known as "Latin-1". Similarly, there is now "Latin-2", "Latin-3", etc.

A solution was sought. That solution has appeared in what has become known as "UNICODE". After several attempts at a multilingual system, UNICODE, short for Unification Code, was developed to provide a unique number identifier to every possible piece of textual data. Using a 16-bit encoding means that code values are available for more than 65,000 characters. While this number is sufficient for coding the characters used in the major languages of the world, the UNICODE Standard and ISO/IEC 10646 provide the UTF-16 extension mechanism (called surrogates in the UNICODE Standard), which allows for the encoding of as many as 1 million additional characters without any use of escape codes. This capacity is sufficient for all known character encoding requirements, including full coverage of all historic scripts of the world.

Though UNICODE has become the multilingual code of choice for American manufacturers, several groups in the Far East have proposed and implemented a UNIX version of a multilingual code. This code uses an editor known as Mule, for MULtilingual Enhancement to GNU Emacs). This editor uses many escape sequences to provide a multi-language capability.

No matter which multilingual code becomes the worldwide standard, all of them must be eventually converted into binary numbers for use on computers and transfer across networks and the internet. As the individual universal code numbers increase in size, so must their binary number representations. Further, if a system based on escape sequences is used, many levels of representation may be necessary. This, too, requires longer binary representations. Further, current mechanical drives, such as standard computer hard drives, store textual representations as binary numbers. Longer textual representations require longer binary representations which in turn require more physical space.

The longer the binary representation, the longer the process time and transfer time for data. As most current applications use some type of buffering when transmitting data, the limited 1's and 0's of binary also require large areas in which buffering may take place. As more and more systems move to wireless methods of communications and storage, transfer and processing time will become critical. It is therefore desirable to provide a method of minimizing the size of data representations.

There is therefore a need for a character code and transmission system and method which avoids these and other problems.

FEATURES OF THE INVENTION

A general feature of the present invention is the provision of a method and system which overcomes the problems found in the prior art.

A further feature of the present invention is the provision of a method and system capable of transmitting and processing a larger amount of more relevant data per unit time.

Another feature of the present invention is the provision of a method and system in which data is encoded using electronic or photonic pulses.

A still further feature of the present invention is the provision of a method and system in which the electronic pulses are wideband.

A still further feature of the present invention is the provision of a method and a system in which an electronic pulse characteristic used for encoding data is pulse duration.

A still further feature of the present invention is the provision of a method and system in which an electronic pulse characteristic used for encoding data is the variable time duration between subsequent pulses.

A still further feature of the present invention is the provision of a method and system in which an electronic pulse characteristic used for encoding data is the phase of a pulse.

A still further feature of the present invention is the provision of a method and system in which an electronic pulse characteristic used for encoding data is the amplitude of a pulse.

A still further feature of the present invention is the provision of a method and system in which an electronic pulse characteristic used for encoding data is the polarity of a pulse.

A still further feature of the present invention is the provision of a method and system in which an electronic pulse characteristic used for encoding data is the shape of a pulse.

A still further feature of the present invention is the provision of a method and system in which multiple electronic pulse characteristics may be used simultaneously to encode data which may include pulse position, and/or time between pulses, and/or pulse amplitude, and/or pulse polarity, and/or pulse phase, and/or pulse shape.

A still further feature of the present invention is the provision of a method and a system in which a photonic pulse characteristic is pulse position.

A still further feature of the present invention is the provision of a method and a system in which a photonic pulse characteristic used for encoding data is on-off keying.

A still further feature of the present invention is the provision of a method and a system in which a photonic pulse characteristic used for encoding data is the variable time duration between subsequent pulses.

A still further feature of the present invention is the provision of a method and a system in which a photonic pulse characteristic used for encoding data is frequency.

A still further feature of the present invention is the provision of a method and system in which multiple photonic pulse characteristics may be used simultaneously to encode data which may include pulse position, and/or time between pulses, and/or pulse phase, and/or on-off keying.

A still further feature of the present invention is the provision of a system and method which modifies the current UNICODE standard character sets by representing the numbers, 0 through 9 (base-10), with a single variable duration electronic or photonic pulse.

Another feature of the present invention is the provision of a method and system which modifies the UNICODE standard character sets for symbols other than numbers with a combination of variable duration electronic or photonic pulses.

A still further feature of the present invention is the provision of a system and method which modifies the current UNICODE standard character sets by representing the numbers, 0 through 9 (base-10), with a single variable duration space between electronic or photonic pulses.

A still further feature of the present invention is the provision of a method and system which modifies the UNICODE standard character sets for symbols other than number with a combination of variable duration spaces between electronic or photonic pulses.

A still further feature of the present invention is the provision of a method and system which modifies the UNICODE standard character sets for symbols other than number with a combination of variable duration pulses and variable duration spaces between electronic or photonic pulses.

A still further feature of the present invention is the provision of a system and method which modifies the current ASCII standard character sets by representing the numbers, 0 through 9 (base-10), with a single variable duration electronic or photonic pulse.

Another feature of the present invention is the provision of a method and system which modifies the ASCII standard character sets for symbols other than numbers with a combination of variable duration electronic or photonic pulses.

A still further feature of the present invention is the provision of a system and method which modifies the current ASCII standard character sets by representing the numbers, 0 through 9 (base-10), with a single variable duration space between electronic or photonic pulses.

A still further feature of the present invention is the provision of a method and system which modifies the ASCII standard character sets for symbols other than number with a combination of variable duration spaces between electronic or photonic pulses.

A still further feature of the present invention is the provision of a method and system which modifies the ASCII standard character sets for symbols other than number with a combination of variable duration pulses and variable duration spaces between electronic or photonic pulses.

A still yet further feature of the present invention is the provision of a method and system in which the value of strings of data is represented in a number base higher than 2, and the value of the string of data is transmitted using electronic pulses which are modulated individually or in combination using variable duration pulses (frequency), and/or variable duration spaces between pulses, and/or pulse amplitude, and/or pulse phase, and/or pulse polarity, and/or pulse shape.

A still yet further feature of the present invention is the provision of a method and system in which the value of strings of data is represented in a number base higher than 2, and the value of the string of data is transmitted using photonic pulses which are modulated individually or in combination using on-off keying, variable duration spaces between pulse, and/or pulse frequency, and/or pulse position.

A still yet further feature of the present invention is the provision of a method and system which pulse characteristics are used to encode data using an M-ary scheme.

Another feature of the present invention is the provision of a system and method which can improve buffering time and reduce needed buffering space.

These, as well as other features and advantages of the present invention will become apparent from the following specification and claims.

SUMMARY OF THE INVENTION

The present invention relates generally to the use of character codes to telecommunicate data. More specifically, and in particular, the present invention comprises a system and method for the use of various pulse characteristics to encode data. The characteristics for electronic pulses for modulating data include, but are not limited to, variable duration pulses (frequency), and/or variable duration spaces between pulses, and/or pulse amplitude, and/or pulse phase, and/or pulse polarity, and/or pulse shape. These characteristics may be modulated individually, or in various combinations with one another. The characteristics for photonic pulses for modulating data include, but is not limited to, on-off keying, variable duration spaces between pulses, and/or pulse frequency, and/or pulse position. These photonic pulse characteristics may be modulated individually, or in combination with one other.

The characteristics of electronic or photonic pulses may be used to encode data in a number base higher than 2, such as but not limited to base-3, base-4, base-10, base-256, to encode data for transmission using an ultra wide band wireless or hard-wired medium, or a fiber optic medium. Optical storage mediums such as, but not limited to, CD-ROMs and DVDs could also use variable length pits and/or variable length spaces between pits, and/or variable depth pits, to encode data in any number based, such as but not limited to, base-2, base-3, base-4, base-10, base-256, etc.

Current UNICODE representations are listed in tables which may be stored electronically in a 256×256 array. A character code is assigned to each code element defined by the UNICODE standard. Each of these character codes is currently represented by a binary number. The present invention uses variable length pulses to represent all singular numerical digits 0 through 9. As each character in UNICODE is assigned a unique number, the variable duration pulses of the present invention send the actual number of the UNICODE character in an overall shorter string of numbers which may be read directly, rather than a string of binary numbers which must be further interpreted. Alternatively, the base-10 value of strings of binary information may be calculated and used to transmit and receive data.

In addition, the present invention can be used to encode data using an M-ary scheme.

The coding system of the present invention is based upon a series of pulses transmitted and received over an ultra wide band and/or fiber optic system. Currently, Time Domain, Inc. has developed an impulse radio system which incorporates time modulated ultra wide band technology. Impulse radio systems are described in a series of patents, including U.S. Pat. No. 4,641,317 (issued Feb. 3, 1987), U.S. Pat. No. 4,813,057 (issued Mar. 14, 1989), U.S. Pat. No. 5,363,108 (issued Nov. 8, 1994), and U.S. Pat. No. 6,031,862 (issued Feb. 29, 2000) all to Larry W. Fullerton. Other types of ultra wide band systems are described in U.S. Pat. No. 5,901,172 to Robert J. Fontana, et al, and U.S. Pat. No. 6,026,125 to J. Frederick Larrick, Jr., et al. These patent documents are herein incorporated by reference.

As a time modulated system sends out a signal or pulse, it varies the position of the pulse in time or offsets the pulse from its original location, thus varying the pulse to pulse interval on a pulse to pulse basis. Currently the interval which is varied is large enough to allow a series of pulses or a string to be offset as a group prior to the next pulse or string being sent.

Further, each pulse may be elongated to last for a predetermined and programmable length of time, or what is commonly known as frequency hopping. Thus, the offset of the pulse may be used for additional security purposes rather than as a means with which to transmit data. The length of the pulse becomes the data which is sent. By varying the length of the pulse, data may be transmitted using more than the 0 or 1 used in binary language.

Ultra wide band hard-wired and wireless systems can detect the start of a pulse, and the system may be programmed to listen for the end of the pulse which may vary in duration according to programming. In the preferred embodiment of the present invention ten variable duration pulses and/or ten variable duration spaces between pulses are used to represent numbers 0-9. For example, the number 1 is a pulse of 50 pico seconds in duration. Other numbers and their corresponding pulse durations are shown in Chart 1.

In an alternate embodiment of the present invention, a constant duration pulse is broadcast at varying times from the pulse neutral position to represent numbers 0-9 (base-10), as shown in Chart 8. This embodiment would have particular benefit in a time modulated, ultra wideband system.

DETAILED DESCRIPTION OF THE PRESENT INVENTION

Figure 1:
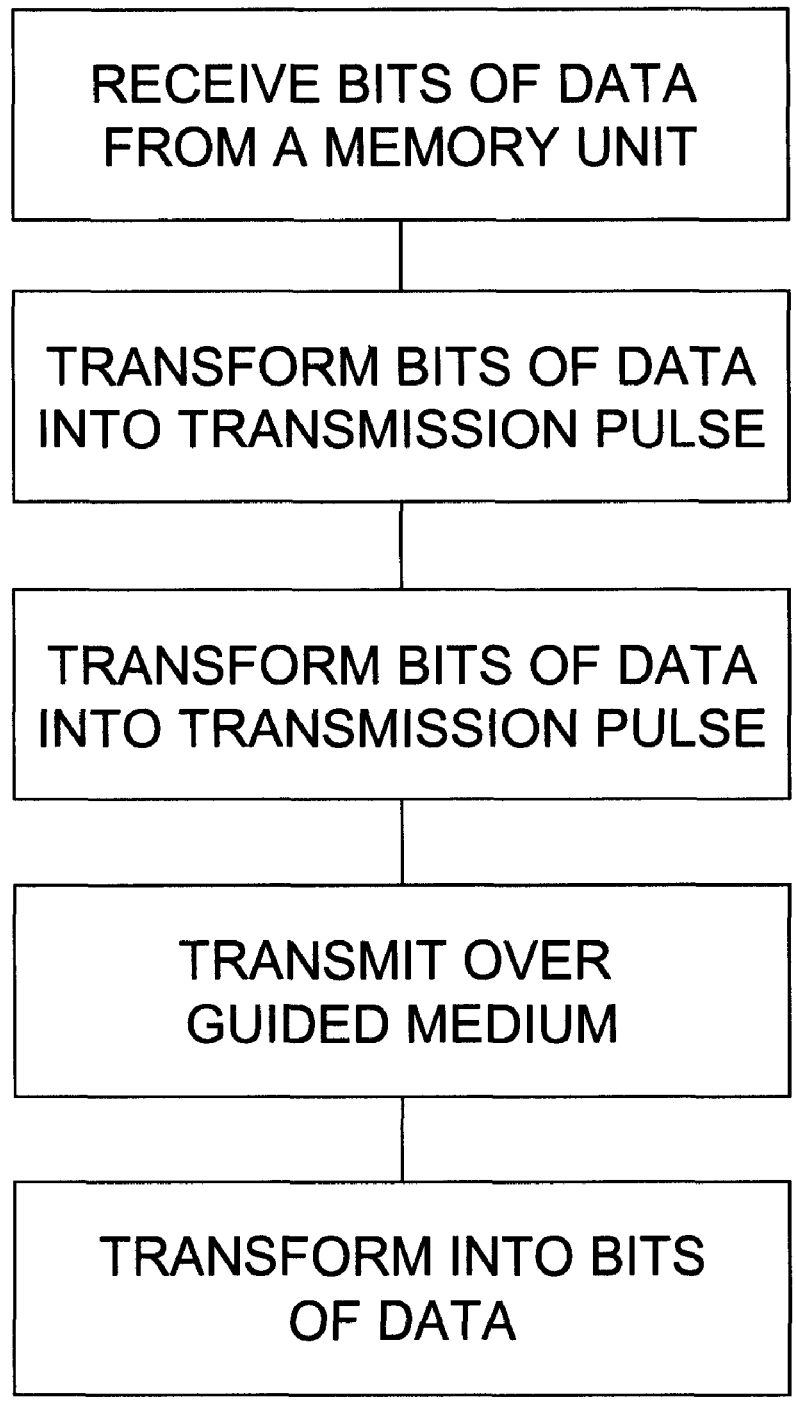
FIG. 1 is a diagram illustrating a method.

The present invention relates in general to a unique method for representing data used by the telecommunication and computer industries. More specifically and in particular, the present invention is a new standard symbology comprised of variable duration pulses and/or variable duration spaces between pulses that can be used in a variety of ways to represent ASCII and UNICODE symbols, or values of lengths of data strings in higher number bases. The electronic or photonic pulse characteristics that are useful will vary depending on the transmission media.

The present invention replaces the current de facto standard of binary coding of information for use by computers and telecommunications, by instead representing each number, 0 through 9 (base-10), or a number base higher than 2, with electronic or photonic pulses that are encoded using various pulse characteristics. The characteristics for electronic pulses for modulating include, but are not limited to, variable duration pulses (frequency), and/or variable duration spaces between pulses, and/or pulse amplitude, and/or pulse phase, and/or pulse polarity, and/or pulse shape. These characteristics may be modulated individually, or in various combinations with one another. The characteristics for photonic pulses for modulating data include, but is not limited to, on-off keying, variable duration spaces between pulses, and/or pulse frequency, and/or pulse position. These photonic pulse characteristics may be modulated individually, or in combination with one another.

The present invention may be used to represent ASCII or UNICODE symbols, or the value of strings of data transmitted in a number base higher than 2.

The system of the present invention includes an impulse radio transceiver which can generate a variable duration pulse and/or a variable duration space between pulses in the following manner. Combinations of numbers, 0 through 9 (base-10), or a number base higher than 2, which represent bits of digital input data, such as ASCII or UNICODE, or the value of strings of data, are stored in a memory unit. The digital output, numbers 0 through 9 (base-10), would be assigned an address in a memory unit. As a result, upon being addressed, a discrete output number would be fed to a Digital/Analog converter unit. The Digital/Analog converter unit would then output an analog signal proportional to the input number (see Chart 1) which would then be fed to a trigger generator. As an example, the trigger generator, e.g., an avalanche mode operated transistor, would provide a sharply rising electrical output at the 10,000 Hz rate or a like response of light output, e.g., by ultraviolet laser, dependant upon the transmitter to be driven.

An input signal, which is a proportionally variable duration pulse and/or a variable duration space between pulses, representative of a number, 0 through 9 (base-10), or a number base higher than 2, is fed to a trigger generator and rapidly turns "on" a switch for a proportional amount of time, thus creating electronic or photonic pulses. The switch, for example, may be an electrically operated or light operated switch, such as a diamond switch in response to an ultraviolet laser triggering device via fiber optic. Importantly, it must be capable of switching in a period of a nanosecond or less. It is then switched "on" to discharge a broadcast antenna which was earlier charged from a power source, for example in the range of 100 to 5,000 volts. The switch may also discharge its output to a fiber optic cable. Such output allows data to travel at the speed of light rather than the speed of sound. Further, through the use of a repeater, data stored in the form of light pulses and/or spaces there between may be stored on a loop of fiber optic cable.

Storage on a network may occur by turning a repeater "on" and pulses of data may be accessed at any time by viewing the looped signal or pulses input to the repeater through well known programming methods. The data may be altered by adjusting the output of the repeater through well known programming methods to incorporate the desired changes, thus saving the data to the loop.

Similarly, the output of the switch may be used to generate pits on a compact or digital versatile disk or any other type of optical storage media. The recording lasers which currently are pulsed for constant durations of time to represent a "1" or a "0" are instead pulsed for a variable amount of time, thus generating pits of constant depth, and/or varying spaces between pits, and/or pits of varying depths, and/or pits of varying lengths, which may be used individually or in combination to encode data.

These proportionally variable duration pulses and/or variable duration spaces between pulses, are detected by an impulse radio receiver or other transceiver that has been programmed to capture and interpret such pulses and/or spaces. The present invention uses variable duration pulses and/or variable duration spaces between pulses for coding to achieve a more efficient universal character set. Single variable duration pulses and/or variable duration spaces between pulses that are mathematically significant and relate to the numbers, 0 through 9 (base-10), or a number base higher than 2, are used in conjunction with a character set like ASCII, or an expanded universal character set like UNICODE, or a value of a string of data.

The first embodiment of the present invention includes single variable duration pulses and/or variable duration spaces between pulses representing numbers, 0 through 9 (base-10), and combinations of variable duration pulses, and/or variable duration spaces between pulses to represent all other standard UNICODE symbols.

First Embodiment

The first embodiment of the present invention is a modification of the UNICODE standard symbology. This modification represents the numbers, 0 through 9 (base-10), using only a single variable duration pulse and/or variable duration space between pulses. Computers using this modification perform base-10 math. Base-10 math is more efficient and up to eight times faster than the base 2 math now required with binary symbology. All other standard UNICODE symbols would be represented by combinations of variable duration pulses and/ or variable duration spaces between pulses as opposed to a sixteen digit binary number. The main advantage of UNICODE is a standard symbol set can be used by computers for universal data interchange. One example of a scheme to use single variable duration pulses and/or variable duration spaces between pulses to represent numbers, 0 through 9, is shown in Chart 1:

CHART 1

| NUMBER | PULSE DURATION AND/OR SPACE DURATION BETWEEN PULSES (PICO-SECONDS) |
|---|---|
| 1 | 50 |
| 2 | 100 |
| 3 | 150 |
| 4 | 200 |
| 5 | 250 |
| 6 | 300 |
| 7 | 350 |
| 8 | 400 |
| 9 | 450 |
| 0 | 500 |

It is important to note that in the scheme represented in Chart 1, the following mathematically significant relationship exists:

Integer (1-9)=integer X base pulse duration (50 pico-seconds)

Zero=500 pico-seconds

Even though Chart 1 depicts the above relationship, it should be obvious to those skilled in the art that any interval of pulse timing can be used. For example, the base pulse duration and/or space duration between pulses could be 40 pico-seconds, or 100.7 pico-seconds, or any other duration for a specific number that can be represented in a number base higher than 2.

This relationship can be used for base 10 computing without converting from any of the commonly used math schemes such as, base 2, octal or hexadecimal in a computer.

The example below in Chart 2, illustrates adding the numbers 347 to 226 to 151 by summing the total pulse duration and/or space duration between pulses in the ones column, the tens column, and the hundreds column.

CHART 2

| FUNCTION | PULSE AND/OR SPACE COUNT (HUNDREDS) | PULSE AND/OR SPACE COUNT (TENS) | PULSE AND/OR SPACE COUNT (ONES) |
|---|---|---|---|
| 347 | 3 | 4 | 7 |
| +226 | 2 | 2 | 6 |
| +151 | 1 | 5 | 1 |
| Accumulated Total | 6 | 11 | 14 |
| Interpreted As | 6(100s) | 1(100s) 1(10s) | 1(10s) 4(1s) |
| Answer Analog = 724 | 7(100s) | 2(10s) | 4(1s) |

Chart 3 represents information contained in Chart 2 using current binary coding methods.

CHART 3

| FUNCTION | EIGHT BIT BINARY (HUNDREDS) | EIGHT BIT BINARY (TENS) | EIGHT BIT BINARY (ONES) |
|---|---|---|---|
| 347 | 00000011 | 00000100 | 00000111 |
| +226 | 00000010 | 00000010 | 00000110 |
| +151 | 00000001 | 00000101 | 00000001 |
| Accumulated Total | 00000110 | 00001011 | 00001110 |
| Interpreted As | 00000110(100s) | 00000001(100s) 00000001(10s) | 00000001(10s) 00000100(1s) |
| Answer Analog = 724 | 7(100s) | 2(10s) | 4(1s) |

As an example, in Chart 2 the numbers 347, 226, and 151 are each represented by 3 pulses and/or spaces between pulses of data. In Chart 3 the numbers 347, 226, and 151 are each represented by 24 bits, of data. Comparing the amounts of data in Charts 2 and 3, it is obvious the present invention's variable pulsed symbology method requires fewer pulses and/or spaces than the standard binary number method, by a ratio of 1 to 8, or $1/8^{th}$. The inverse of this ratio would indicate that the amount of relevant information processed or transmitted could increase by a factor of 8. This increase in relevant information relates to more efficient use of symbols in computers and telecommunications.

If the numbers in Chart 3 were represented by the UNICODE standard character set, the numbers, 0 through 9 would be represented by sixteen digit binary numbers. Therefore, the ratio of pulses and/or spaces to bits in this scenario would be 1 to 16, or $1/16^{th}$. The inverse of this ratio would indicate that the amount of relevant information processed or transmitted could increase by a factor of 16.

Another application of the present invention would include Internet Protocol (IP) addresses used in telecommunications. Current IP addresses consist of 32 bits of binary numbers. The present invention can represent an IP address with 12 variable duration pulses and/or variable duration spaces between pulses.

There are more computing operations required to process binary numbers mathematically than when using base 10 numbers. The exact number of operations will differ with each computation due to the number of values involved or the operation that is being computed. Using the method described in the present invention, the number of processing operations will be fewer when using variable pulse symbology to represent numbers in base 10.

The present invention is a modification to UNICODE standard character sets described in *The UNICODE® Standard* A Technical Introduction. This modification changes the representation of numbers, 0 through 9 (base-10), in any version of UNICODE standard character sets from a sixteen digit binary number to a single variable duration pulse and/or variable duration space between electronic or photonic pulses. All other symbols in any UNICODE standard character set are represented by combinations of variable duration pulses and/or variable duration spaces between pulses. Chart 4 illustrates a sample of UNICODE symbols other than numbers, 0 through 9 (base-10), represented by a sixteen-digit binary (0,1) number, in comparison with a modified version using combinations of variable duration pulses and/or variable duration spaces between pulses.

CHART 4

| SYMBOL | UNICODE REPRESENTATION (CURRENT) | UNICODE REPRESENTATION (PROPOSED) |
|---|---|---|
| A | 0000000001000001 | 00065 |
| I | 0000000001001001 | 00073 |
| S | 0000000001010011 | 00083 |

The present invention does not affect computer clock speed, but simply allows more relevant bits of information to be processed per unit of time or transmitted over a telecommunication network per unit of time. Chart 4 demonstrates that current UNICODE representation of data is sixteen bits long. The corresponding UNICODE symbol using the present invention's variable duration pulse scheme based on Chart 1, consists of five pulses and/or spaces between pulses. This represents an apparent speed increase for computing or telecommunication of 16 to 5, or 3.33 times faster for textual based operations.

In addition to variable pulse durations, and variable spaces between pulses, the characteristics available for modulating electronic pulses in number bases higher than 2 include, but is not limited to, pulse amplitude, and/or pulse phase, and/or pulse polarity, and/or pulse shape.

The characteristics for photonic pulses for modulating data include, but is not limited to, on-off keying, variable duration spaces between pulse, and/or pulse frequency, and/or pulse position. These photonic pulse characteristics may be modulated individually, or in combination with one other.

The second embodiment of the present invention are single variable duration pulses and/or variable duration spaces between pulses representing numbers, 0 through 9 (base-10), and combinations of variable duration pulses and/or variable duration spaces between pulses to represent all other standard ASCII symbols.

Second Embodiment

This modification changes the representation of numbers, 0 through 9 (base-10), in any version of ASCII standard character sets from a eight digit binary number to a single variable duration and/or variable duration spaces between pulses electronic or photonic pulse. All other symbols in any ASCII standard character set are represented by combinations of variable duration pulses and/or variable duration spaces between pulses. Chart 5 illustrates a sample of ASCII symbols other than numbers, 0 through 9 (base-10), represented by an eight digit binary (0,1) number, in comparison with a modified version using combinations of variable duration pulses.

CHART 5

| SYMBOL | ASCII 8859-1 REPRESENTATION (CURRENT) | ASCII 8859-1 REPRESENTATION (PROPOSED) |
|---|---|---|
| A | 01000001 | 065 |
| I | 01001001 | 073 |
| S | 01010011 | 083 |

The present invention does not affect computer clock speed, but simply allows more relevant bits of information to be processed per unit of time. Chart 5 demonstrates that current ASCII representation of data is eight bits long. The corresponding ASCII symbol using the present invention's variable duration pulse scheme based on Chart 1, consists of three variable duration pulses and/or variable duration spaces between pulses. This represents an apparent speed increase for computing or telecommunication of 8 to 3, or 2.67 times faster for textual based operations.

In addition to variable pulse durations, and variable spaces between pulses, the characteristics available for modulating electronic pulses in number bases higher than 2 include, but is not limited to, pulse amplitude, and/or pulse phase, and/or pulse polarity, and/or pulse shape.

The characteristics for photonic pulses for modulating data include, but is not limited to, on-off keying, variable duration spaces between pulse, and/or pulse frequency, and/or pulse position. These photonic pulse characteristics may be modulated individually, or in combination with one other.

The two embodiments of the present invention describe three methods of employing variable duration symbology to represent data used by computers and/or telecommunication networks. In the first method, only variable duration pulses are used to represent data. In the second method, only variable duration spaces between pulses are used to represent data. The third method uses a combination of both variable duration pulses and variable duration spaces between pulses to represent data.

In the third method, there are two alternatives in which a combination of both variable duration pulses and variable duration spaces between pulses can be used to represent data.

The first alternative method is called cascading. This is defined as variable duration pulses and variable duration spaces between pulses alternating to represent data. As an example, in Chart 6 the UNICODE character 15461 would be represented by the following cascade of variable duration pulses and variable duration spaces between pulses used to represent the data.

CHART 6

| UNICODE CHARACTER NUMBER | PULSE DURATION AND/OR SPACE DURATION BETWEEN PULSES (PICO-SECONDS) (SEE CHART 1) | PULSE OR SPACE |
| --- | --- | --- |
| 1 | 50 | PULSE |
| 5 | 250 | SPACE |
| 4 | 200 | PULSE |
| 6 | 300 | SPACE |
| 1 | 50 | PULSE |

The second alternative method for using a combination of variable duration pulses and variable duration spaces between pulses is called double-coding. This is defined as the variable duration pulses used to represent a UNICODE character, and the variable duration spaces between pulses used to represent meta data. As an example, in Chart 7 the UNICODE character number 15461 would be represented by the variable duration pulses, and meta data number 6739 is represented by the variable duration spaces between pulses. This meta data, or "XML-type" tagging would be used to drive look-up tables in which the number represented by the variable duration spaces between pulses was equivalent to a tag word, not just a single character. Using only the four variable duration spaces between pulses would allow a table of 9,999 meta data or "XML-type" tags to be created. If an extra pulse, or an "anchor pulse" were used, five variable duration spaces between pulses would allow a table of 99,999 meta data or "XML-type" tags to be created, etc.

Extending the use of encoding entire words as described above with the meta tags could also be applied to combinations of UNICODE characters which make up words. As an example, an eight bit number represented by eight variable duration pulses and/or variable duration spaces between pulses would represent 99,999,999 words. As an example, the world "elephant" would require eight UNICODE characters, or 128 bits of data. By using an eight bit number in a look-up table, such as 19876543 to represent the word "elephant" would save 120 bits of data.

CHART 7

| UNICODE CHARACTER NUMBER | META DATA NUMBER | PULSE DURATION AND/OR SPACE DURATION BETWEEN PULSES PICO-SECONDS (SEE CHART 1) | PULSE OR SPACE |
| --- | --- | --- | --- |
| 1 | | 50 | UNICODE PULSE |
| | 6 | 300 | META SPACE |
| 5 | | 250 | UNICODE PULSE |
| | 7 | 350 | META SPACE |
| 4 | | 200 | UNICODE PULSE |
| | 3 | 150 | META SPACE |
| 6 | | 300 | UNICODE PULSE |
| | 9 | 450 | META SPACE |
| 1 | | 50 | UNICODE PULSE |

In an alternate embodiment of the present invention a constant duration pulse is broadcast at varying times from the pulse neutral position to represent numbers 0-9 (base-10), as shown in Chart 8. This embodiment would have particular benefit in a time modulated, ultra wideband system.

CHART 8

| NUMBER | PULSE START TIME DIFFERENCE FROM NEUTRAL POSITION OF THE PULSE (PICO-SECONDS) |
| --- | --- |
| 1 | 50 |
| 2 | 100 |
| 3 | 150 |
| 4 | 200 |
| 5 | 250 |
| 6 | 300 |
| 7 | 350 |
| 8 | 400 |
| 9 | 450 |
| 0 | 0 |

It is important to note that in the scheme represented in Chart 8, the following mathematically significant relationship exists:

Integer (0-9) X pulse time difference (50 pico-seconds)

Even though Chart 8 depicts the above relationship, it should be obvious to those skilled in the art that any interval of pulse time difference can occur. For example, the pulse time difference could be 40 pico-seconds, or 100.7 pico-seconds, or any other duration for a specific number that can be represented in a number base higher than 2.

Using this alternative method of representing the numbers 0-9 (base-10) supports the examples of charts 2, 3, 4, and 5 which demonstrate base-10math and new representations for UNICODE and ASCII symbols, or values of strings of data.

Base-10 has been used to describe the present invention in the preferred embodiments, but it should be obvious to one skilled in the art that the present invention is useful for any number base higher than 2 to encode more data per unit of time.

Throughout the present invention, variable duration electronic or photonic pulses, and variable duration spaces between electronic or photonic pulses, have been described in the preferred embodiments of the present invention. However, one who is skilled in the art would instantly recognize that other pulse characteristics described can be used to encode date in number bases higher than 2. These characteristics for electronic pulses for modulating include, but are not limited to, variable duration pulses (frequency), and/or variable duration spaces between pulses, and/or pulse amplitude, and/or pulse phase, and/or pulse polarity, and/or pulse shape. These characteristics may be modulated individually, or in various combinations with one another. The characteristics for photonic pulses for modulating data include, but is not limited to, on-off keying, variable duration spaces between pulse, and/or pulse frequency, and/or pulse position. These photonic pulse characteristics may be modulated individually, or in combination with one other. These electronic pulses may be transmitted wireless, or over any conductive hard-wired mediums, such as but not limited to un-bonded telephone twisted pairs, bonded telephone twisted pairs, CATV coaxial cable, CAT-5 cable, power lines, other conductive mediums, such as but not limited to, metallic car and truck bodies, ship and submarine hulls, decks and bulkheads, aircraft fuselages, structural steel, missile bodies, tank bodies, water pipes, etc., and non-metallic mediums, such as but not limited to, the human body, etc. The photonic pulses may be transmitted over fiber optic mediums, or free space.

A general description as well as a preferred embodiment of the present invention has been set forth above. Those skilled in the art to which the present invention pertains will recognize and be able to practice additional variations in the methods and systems described which fall within the teachings of this invention. Accordingly, all such modifications and additions are deemed to be within the scope of the invention.

What is claimed is:

1. A method of transmitting data over fiber optic cable, the method comprising:
    receiving a first plurality of digital bits of data from a memory unit;
    receiving a second plurality of digital bits of data from a memory unit;
    receiving a third plurality of digital bits of data from a memory unit;
    transforming the first plurality of bits of data into a photonic transmission pulse, the photonic transmission pulse having a first pulse duration selected from a set of three or more predetermined pulse durations, one of which is corresponding to the first bits of data;
    transforming the third plurality of bits of data into a photonic transmission pulse, the photonic transmission pulse having a third pulse duration selected from a set of three or more predetermined pulse durations, one of which is corresponding to the third plurality of bits of data;
    determining the transmission time for the second plurality of bits of data, the transmission time having a duration selected from a set of three or more predetermined durations, one of which is corresponding to the second plurality of bits of data;
    transmitting the first photonic transmission pulse;
    postponing the transmission of the third photonic transmission pulse by a time equal to the transmission time for the second bits of data; and
    transmitting the third photonic transmission pulse.

2. The method of claim 1 wherein the transmission pulses represent data in the form of universal character coding.

3. The method of claim 1 wherein the transmission time represents data in the form of universal character coding.

4. The method of claim 1 wherein the transmission time represents data in the form of meta data.

5. The method of claim 4 wherein the subset of bit sequences correspond with number symbols 0 to 9.

6. The method of claim 1 wherein the bit sequences correspond to ASCII symbology.

7. A method of transmitting data over a fiber optic transmission medium, the method comprising:
    receiving a first plurality of digital bits of data from a memory unit;
    receiving a second plurality of digital bits of data from a memory unit;
    receiving a third plurality of digital bits of data from a memory unit;
    transforming the first plurality of bits of data into a transmission pulse of photonic energy, the photonic transmission pulse having a first pulse position selected from a set of three or more predetermined pulse positions, one of which is corresponding to the first plurality of bits of data;
    transforming the third plurality of bits of data into a transmission pulse of photonic energy, the photonic transmission pulse having a third pulse position selected from a set of three or more predetermined pulse positions, one of which is corresponding to the third plurality of bits of data;
    determining the time of transmission for the second bit of data, the time of transmission having a duration selected from a set of three or more predetermined durations, one of which is corresponding to the second plurality of bits of data;
    transmitting the first photonic transmission pulse over a fiber optic transmission medium;
    postponing the transmission of the third photonic transmission pulse by a time equal to the transmission time for the second bits of data; and
    transmitting the third photonic transmission pulse over a transmission medium.

8. The method of claim 7 wherein the photonic transmission pulse positions correspond to a number base higher than 2.

9. The method of claim 7 wherein the duration between photonic transmission pulses correspond to a number base higher than 2.

10. The method of claim 7 wherein the photonic transmission pulses represent data in the form of universal character coding.

11. The method of claim 7 wherein the transmission time represents data in the form of universal character coding.

12. The method of claim 7 wherein the transmission time represents data in the form of meta data.

13. A method of providing symbology for representing data in transmission of photonic pulses, comprising:
    determining a plurality of subsets of bit sequences within a set of bit sequences;
    representing each of the plurality of subsets of bit sequences with a variable duration photonic pulse or a variable duration space unconstrained by time slots;
    assigning a photonic pulse duration or a pulse spacing to each of the plurality of subsets of bit sequences wherein each of the plurality of subsets of bit sequences represents a plurality of bits; and
    using the photonic pulses and the spaces to transmit data, wherein at least one of the plurality of subsets being represented by one of the photonic pulse durations and an adjacent one of the plurality of subsets being represented by one of the space durations.

14. The method of claim 13 wherein the bit sequences correspond to UNICODE symbology.

15. The method of claim 14 wherein the subset of bit sequences correspond with number symbols 0 to 9.

16. A method of providing pulse symbology for representing data in transmission of photonic pulses using a baseband signal in a fiber optic system to increase efficiency of the transmission, comprising:
- determining a plurality of subsets of bit sequences wherein each of the plurality of subsets of bit sequences comprise a plurality of bits;
- representing each of the plurality of subsets of bit sequences as a variable photonic pulse duration or a variable duration space unconstrained by time slots;
- assigning a single photonic pulse duration or a single pulse spacing to each of the plurality of subsets of bit sequences to thereby represent data; transmitting data from the fiber optic system using the photonic pulses and the spaces; and
- wherein at least one of the plurality of subsets being represented by a photonic pulse duration and an adjacent one of the plurality of subsets being represented by a space duration.

17. The method of claim 16 wherein both single variable duration photonic pulses and single variable duration spaces represent bit sequences.

18. The method of claim 16 wherein the transmission comprise a continuous plurality of photonic pulse and spaces, the photonic pulses each having a single variable duration associated with one of the bit sequence and the spaces each having a single variable duration associated with one of the bit sequences.

19. The method of claim 16 wherein the bit sequences correspond to UNICODE symbology.

20. The method of claim 16 wherein the bit sequences correspond to number symbols 0 to 9.

21. The method of claim 16 wherein the bit sequences correspond to ASCII symbology.

22. The method of claim 16 further comprising transmitting the photonic pulses.

23. A method of providing pulse symbology for representing data in transmission of photonic pulses in a fiber optic system to increase efficiency of the transmission, comprising:
- representing character symbols using number symbols 0 to 9;
- representing each of the number symbols 0 to 9 with a single duration space that is variable or a single duration photonic pulse that is variable to thereby represent data using photonic pulses for use in the fiber optic system;
- transmitting using a modulated photonic system a photonic signal transmission comprised of single duration spaces and single duration photonic pulses, each of the single duration spaces and the single duration photonic pulses representing one of the number symbols.

24. The method of claim 23 wherein the character symbols are ASCII characters.

25. The method of claim 23 wherein the character symbols are Unicode characters.

26. The method of claim 23 wherein the representing each of the number symbols 0 to 9 with a single duration photonic space that is variable or a single duration photonic pulse that is variable to thereby represent data using photonic pulses for use in the time-modulated photonic system comprises representing each of the number symbols 0 to 9 with the single duration photonic space that is variable and the single duration photonic pulse that is variable to thereby represent data using photonic pulses for use in the time-modulated photonic.

27. A method of providing symbology for representing data in transmission of photonic pulses to increase efficiency of the transmission, comprising:
- determining a plurality of subsets of bit sequences within a set of bit sequences;
- representing each of the plurality of subsets of bit sequences with a variable duration photonic pulse and a variable duration space;
- assigning a photonic pulse duration and a photonic pulse spacing to each of the plurality of subsets of bit sequences wherein each of the plurality of subsets of bit sequences represents a plurality of bits; and
- using the photonic pulses and spaces to transmit data, alternating photonic pulses and spaces in a fiber optic signal.

28. A method of transmitting data using pulse modulation, the method comprising:
- receiving bits of data from a memory unit;
- transforming a plurality of the bits of data into a photonic pulse, the photonic pulse having a pulse duration selected from a set of ten predetermined pulse durations, one of which is corresponding to the plurality of bits of data; and
- transmitting the photonic pulse over a fiber optic medium to a receiver; wherein each of the pulse durations within the set of ten predetermined pulse durations corresponds to one of integers 0 through 9.

29. The method of claim 28 wherein the data is in the form of universal character encoding.

30. The method of claim 28 further comprising: receiving the photonic pulse from the fiber optic medium at the receiver; and transforming the photonic pulse into the plurality of bits of data corresponding to the durations of the photonic pulse.

31. A method of transmitting data, comprising:
- representing a character with a numeric base-10 character code;
- transforming each digit of the numeric base-10 character code into an photonic pulse, the photonic pulse having a pulse duration selected from a set of ten predetermined photonic pulse durations, one of which is corresponding to the digit; and
- transmitting the photonic pulse over a fiber optic medium to a receiver; and
- wherein each of the photonic pulse durations within the set of ten predetermined photonic pulse durations corresponds to one of integers 0 through 9.

* * * * *